United States Patent
Nguyen

(10) Patent No.: US 7,755,200 B2
(45) Date of Patent: Jul. 13, 2010

(54) METHODS AND ARRANGEMENTS FOR FORMING SOLDER JOINT CONNECTIONS

(75) Inventor: Hau Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 24 days.

(21) Appl. No.: 12/210,920

(22) Filed: Sep. 15, 2008

(65) Prior Publication Data

US 2010/0068466 A1    Mar. 18, 2010

(51) Int. Cl.
  *H01L 23/48* (2006.01)
(52) U.S. Cl. .................. 257/773; 257/738; 257/739; 257/772; 257/779; 257/780
(58) Field of Classification Search ......... 257/738–739, 257/772–773, 779–780; 228/56, 3, 245–246
  See application file for complete search history.

(56) References Cited

U.S. PATENT DOCUMENTS 6,793,116 B2 * 9/2004 Harada ...................... 228/56.3

2007/0290339 A1 * 12/2007 Suh et al. .................... 257/737

* cited by examiner

*Primary Examiner*—Cathy Lam
(74) *Attorney, Agent, or Firm*—Beyer Law Group LLP

(57) ABSTRACT

The present invention relates to methods and arrangements for forming a solder joint connection. One embodiment involves an improved solder ball. The solder ball includes a perforated, metallic shell with an internal opening. Solder material encases the shell and fills its internal opening. The solder ball may be applied to an electrical device, such as an integrated circuit die, to form a solder bump on the device. The solder bump in turn can be used to form an improved solder joint connection between the device and a suitable substrate, such as a printed circuit board. In some applications, a solder joint connection is formed without requiring the application of additional solder material to the surface of the substrate. The present invention also includes different solder bump arrangements and methods for using such arrangements to form solder joint connections between devices and substrates.

9 Claims, 2 Drawing Sheets

METHODS AND ARRANGEMENTS FOR FORMING SOLDER JOINT CONNECTIONS

FIELD OF THE INVENTION

The present invention relates generally to the packaging of integrated circuits (ICs). More particularly, the invention relates to methods and arrangements for forming solder joint connections.

BACKGROUND OF THE INVENTION

There are a number of conventional processes for packaging integrated circuits. Many packaging techniques position solder bumps onto associated contact pads formed on an active face of a die to provide electrical interconnects to external devices. The die is then typically attached to a suitable substrate, such as a printed circuit board ("PCB"), such that the solder bumps on the die are surface mounted to solder pads on the substrate. The solder bumps are then reflowed to form solder joint connections between the substrate and the attached die.

Solder bumps and solder joint connections sometimes incorporate polymer/copper balls to maintain the height and structural integrity of the solder joint connections. An example of such a solder bump is presented in FIG. 1. FIG. 1 diagrammatically illustrates solder bump 100 supported by underbump metallization layer ("UBM") 102 and integrated circuit die 104. Solder bump 100 includes ball 106 and solder material 108. Ball 106 is made of polymer core 112 completely encased in copper shell 110.

Solder bump 100 may be used to connect die 104 with a printed circuit board. Assembly typically involves positioning the solder bump over the contact pad of a PCB. Solder material 108 is then reflowed. Solder material 108, however, tends to collect near UBM 102 and does not readily engage the surface of the PCB. As a result, additional solder material is often added to the PCB. The reflow process connects the solder material on the PCB with the solder material on the die, thus forming an electrically conductive solder joint connection between the two devices.

The above process, however, is not suitable for rework. That is, if the die and/or solder joint connection become defective after assembly, they will have to be replaced. Attachment of another solder-bumped die having similar polymer core balls, however, would again require the application of additional solder material to the PCB. Such pinpoint deposition is sometimes difficult and impractical.

Although existing approaches work well in many situations, there are ongoing efforts to further improve the design of integrated circuit devices, such that problems like those described above are minimized or eliminated.

SUMMARY OF THE INVENTION

The claimed invention relates to methods and arrangements for forming a solder joint connection. One embodiment involves an improved solder ball. The solder ball includes a perforated shell with an internal opening. Solder material encases the shell and fills its internal opening. The solder ball may be applied to an electrical device, such as an integrated circuit die, to form a solder bump on the device. The solder bump in turn can be used to form a solder joint connection between the device and a suitable electronic substrate, such as a printed circuit board. In some aspects, a solder joint connection is formed without requiring the application of additional solder material to the surface of the substrate.

Another embodiment pertains to a method for forming a solder joint connection. In this embodiment, an electrical device, such as an integrated circuit die, is adhered to a solder bump via a contact pad. The solder bump includes a solder material and a perforated metallic shell. The solder bump on the electrical device is positioned over an associated solder pad of an electronic substrate. The solder material in the solder bump is reflowed, which forms a solder joint connection that includes the metallic shell. The solder joint connection electrically connects the contact pad of the electrical device with the solder pad of the electronic substrate. During the reflow, the solder material from the solder bump is distributed over portions of the solder pad of the electronic substrate. In some embodiments, additional solder material is not added to the solder pad of the electronic substrate from a source other than the associated solder bump.

Another embodiment involves an apparatus for forming a solder joint connection. In this embodiment, an electrical device, such as an integrated circuit die, has multiple contact pads. Each contact pad is adhered to a solder bump having at least some of the aforementioned characteristics.

BRIEF DESCRIPTION OF THE DRAWINGS

The invention and the advantages thereof, may best be understood by reference to the following description taken in conjunction with the accompanying drawings in which.

DETAILED DESCRIPTION OF THE PREFERRED EMBODIMENTS

The present invention relates generally to the packaging of integrated circuits. More particularly, the invention relates to improved methods and arrangements for forming solder joint connections.

As noted earlier, the formation of solder joint connections between, for example, a PCB and an integrated circuit die typically involves the application of additional solder material on the PCB. During initial assembly, such a step is easy to perform. During rework, however, the application of additional solder material is often more difficult. Some embodiments of the present invention address this concern.

One such embodiment is a solder ball suitable for forming a solder joint connection without the application of additional solder material. The solder ball includes a metallic, perforated shell that is encased in and filled with solder material. This solder ball may be applied to an associated contact pad of an electrical device, such as an integrated circuit die, to form a solder bump. In some applications, the solder material from the solder bump is the sole source of solder material used to connect the associated contact pad with a suitable substrate, such as a printed circuit board.

Figure 2:
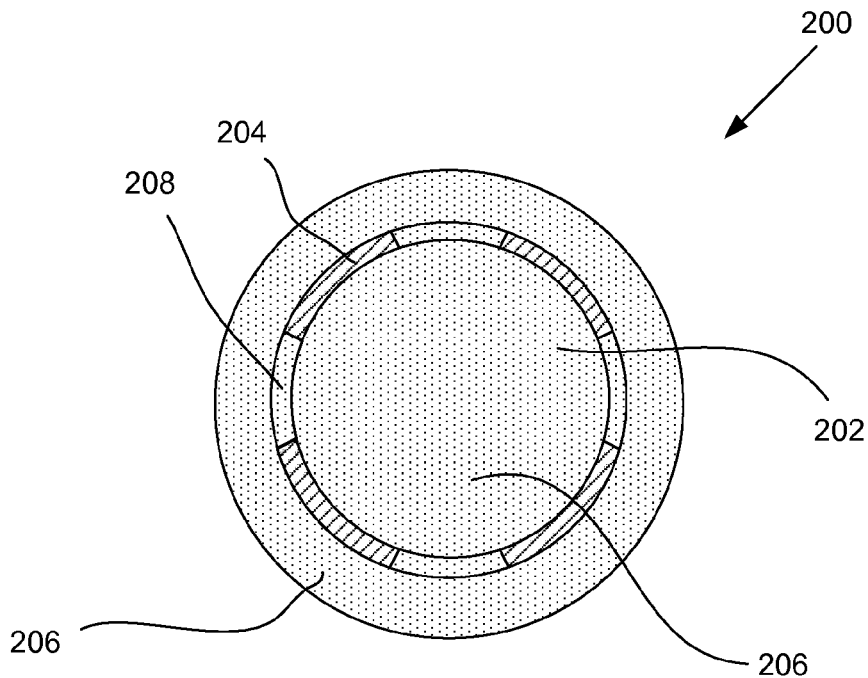
FIG. 2 is a diagrammatic view of a solder ball according to one embodiment of the present invention.

FIG. 2 describes a solder ball according to one embodiment of the present invention. FIG. 2 shows a diagrammatic cross-section of solder ball 200. Solder ball 200 contains a metallic, spherical shell 204 with an internal opening 202. Metallic shell 204 is also perforated with holes 208. Solder material 206 fills internal opening 202, encases shell 204 and extends through holes 208.

The dimensions, composition, structure and shape of the metallic shell and solder ball may vary, depending on the needs of a particular application. By way of example, the thickness of the shell may range from approximately 5 to 15 um and the diameter of the shell may range from approximately 200-280 um. The thickness of the shell and/or of the solder material outside the shell may be substantially uniform. In some embodiments, the shell is made of copper or copper alloy and the solder material is made of a tin-silver, lead-tin or tin-silver-lead. Other measurements and metals may also be used. The size, shape and numbers of holes 208 may differ in different embodiments. The shell is preferably substantially spherical, although other shapes are also possible. The diameter of the shell and the amount of solder material may affect the size and other features of the resulting solder joint connection, and thus should be selected accordingly, as will be discussed below in connection with FIG. 4.

The solder ball may be manufactured in a variety of ways. By way of example, photolithographic techniques and metal plating may be used to selectively apply metal to a solder core to form a filled, perforated shell. Afterward, solder may be plated on to the shell to form a solder ball with the above features. Alternatively, a metal may be plated onto a solder core to form a filled shell. Holes may then be formed in the metal shell using a laser or other suitable techniques. Afterward, additional solder may be plated onto the filled, perforated shell to form the aforementioned solder ball. Other suitable techniques may also be used.

Figure 3:
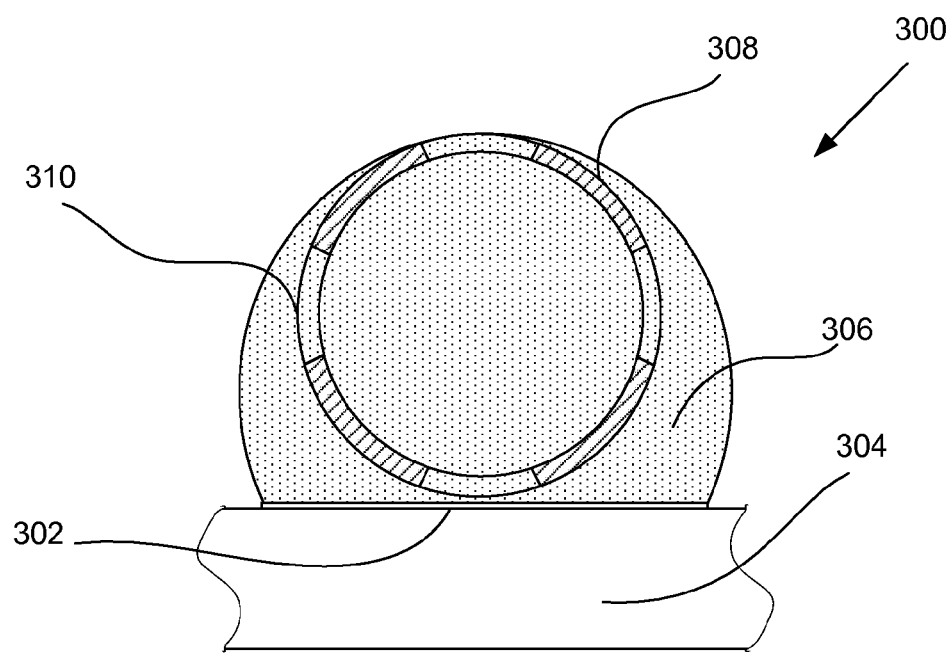
FIG. 3 is a diagrammatic side view of a solder bump on an electrical device according to one embodiment of the present invention.

A solder ball similar to the one illustrated in FIG. 2 may be applied to the contact pad of an electrical device to form a solder bump. An example of such a solder bump soldered to a contact pad is presented with reference to FIG. 3. FIG. 3 includes solder bump 300 mounted on contact pad 302 of electrical device 304. In the illustrated embodiment, electrical device 304 is an integrated circuit die, although any suitable device, such as a packaged semiconductor device (e.g. a ball grid array—BGA) or surface mount device, may also be used. Solder bump 300 contains metallic, perforated shell 308 with holes 310 and solder material 306. Solder material 306 adheres shell 308 to the contact pad and covers at least a portion of the shell.

Figure 4:
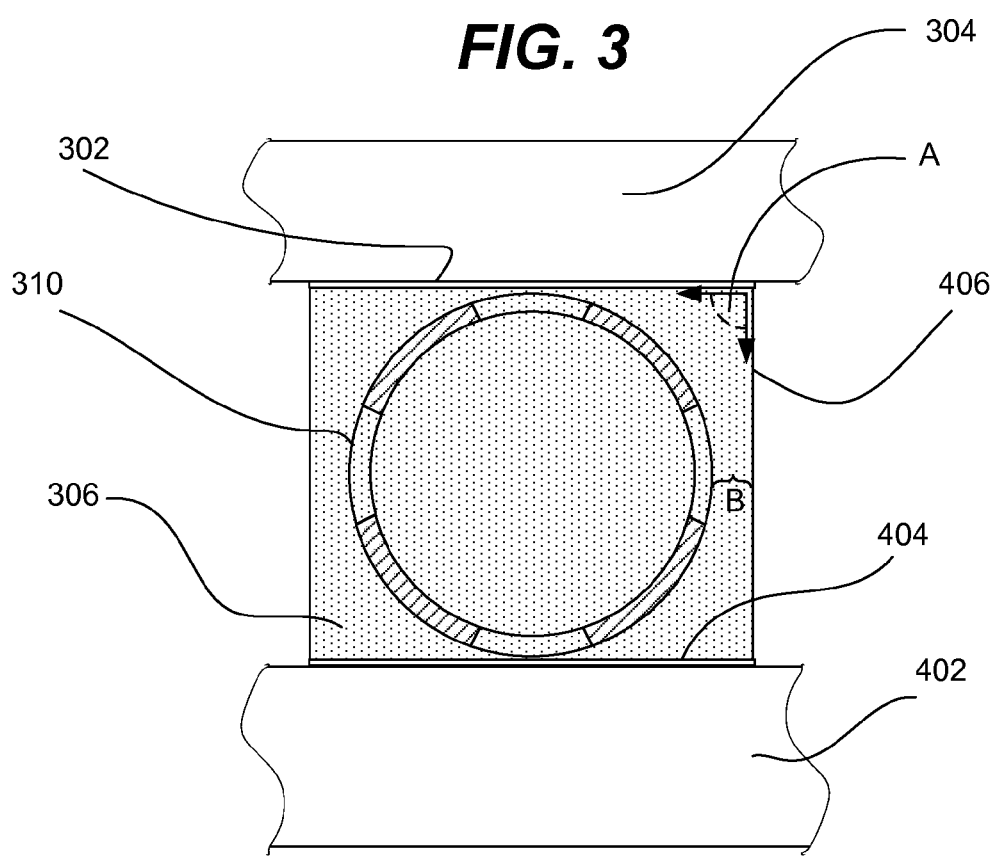
FIG. 4 is a diagrammatic side view of a solder joint connection bonding an electrical device with an electronic substrate according to one embodiment of the present invention.

Referring next to FIG. 4, a method for forming a solder joint connection with the solder bump illustrated in FIG. 3 will be described. FIG. 4 presents a diagrammatic side view of electronic substrate 402, which includes solder pad 404. Electronic substrate 404 may be a printed circuit board with multiple conductive traces electrically connecting solder pad 404 with other components on the board. Other types of electronic substrates may also be used. Solder bump 300 of FIG. 3 is positioned over solder pad 404. Afterward, solder material 306 is reflowed. Holes 310 in shell 308 facilitate the movement of solder material 306 toward the solder pad 404. During the reflow process, the solder material 306 of solder bump 300 is thus distributed over solder pad 404 to form solder joint connection 406. Solder joint connection 406 electrically links the contact pad 302 of electrical device 304 with the solder pad 404 of substrate 402.

Figure 1:
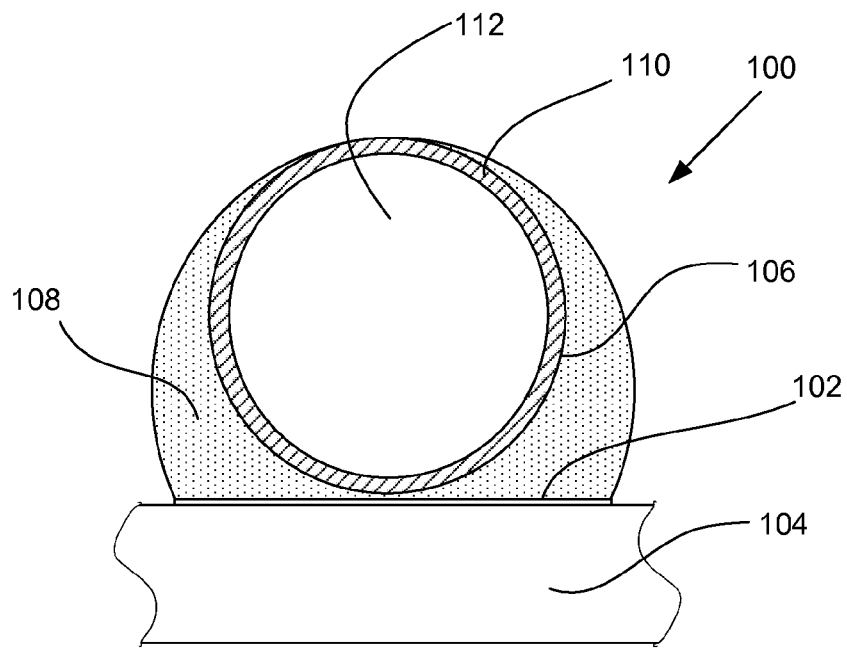
FIG. 1 is a diagrammatic side view of an example solder bump.

With conventional solder bumps such as the one depicted in FIG. 1, the aforementioned redistribution does not take place. As a result, the formation of the solder joint connection requires applying additional amounts of solder material to the solder pad of the substrate to complete the connection. The composition and structure of metallic shell 308 and solder bump 300 of FIG. 3 may eliminate the need for such additional solder material. An advantage of this method is that it simplifies rework and reduces the number of steps needed to repair a faulty solder joint connection or electrical device.

Adjusting the size and features of metallic shell 308 and solder material 306 may influence the dimensions and structure of solder joint connection 406. The size of metallic shell 308, for example, helps to control the standoff distance between contact pad 302 and solder pad 404 and the diameter of solder joint connection 406. The amount of solder material 306 affects the strength of the solder joint connection and its overall shape. These factors, in addition to the size, shape and number of perforations in shell 308, may be adjusted to bring about various desirable attributes in the solder joint connection. By way of example, one such attribute may be to have wetting angle A of FIG. 4 (i.e. the angle between the exterior of the solder joint connection and the contact pad) be as close to 90 degrees as possible. The more perpendicular the angle, the stronger and more reliable the bond between the solder joint connection and the contact pad.

Solder joint connection 406 may assume a variety of shapes and dimensions, depending on the needs of a particular application. By way of example, the solder joint connection could take a convex, concave or columnar shape. Solder wall thickness B, for example, may range from approximately 21 um to 47.5 um. The diameter of the solder joint connection may range from approximately 317 um to 350 um. The height of the solder joint connection may range from approximately 280 to 310 um (including the thickness of the solder pad.) Other shapes and measurements are also possible.

Although only a few embodiments of the invention have been described in detail, it should be appreciated that the invention may be implemented in many other forms without departing from the spirit or scope of the invention. Therefore, the present embodiments should be considered as illustrative and not restrictive and the invention is not limited to the details given herein, but may be modified within the scope and equivalents of the appended claims.

What is claimed is:

1. A solder ball comprising:
   a substantially spherical, hollow, metallic shell having an outer wall and an internal opening, a plurality of holes penetrating entirely through the outer wall of the shell to the internal opening; and
   solder material that encases the metallic shell and fills the internal opening and the plurality of holes, the solder material inside the shell, outside the shell and in the holes of the shell being continuously connected, the solder material arranged to flow out of the internal opening and over a solder pad when the solder ball is positioned over the solder pad during a reflow process.

2. A solder ball as recited in claim 1 wherein the solder material substantially uniformly encases the metallic shell.

3. A solder ball as recited in claim 1 wherein the metallic shell is formed from copper or a copper alloy.

4. A solder ball as recited in claim 1 wherein the solder material is selected from the group consisting of: a tin-silver solder; a lead-tin solder; and a tin-silver-copper solder.

5. An electrical device comprising:
   a substrate;
   a multiplicity of contact pads on the substrate; and
   a plurality of solder bumps, each solder bump adhered to an associated contact pad, the solder bump being suitable for electrically connecting the contact pad on the substrate with an external device, wherein each solder bump includes:
   a substantially spherical, hollow, metallic shell having an outer wall and an internal opening, a plurality of holes penetrating entirely through the outer wall of the shell to the internal opening; and solder material that encases the metallic shell and fills the internal opening and the plurality of holes, the solder material inside the shell, outside the shell and in the holes of the shell being continuously connected, the solder material arranged to flow out of the internal opening and over a solder pad when the solder bump is positioned over the solder pad during a reflow process.

6. An electrical device as recited in claim 5 wherein the metallic shell is formed from copper or a copper alloy.

7. An electrical device as recited in claim 5 wherein the solder material is selected from the group consisting of: a tin-silver solder; a lead-tin solder; and a tin-silver-copper solder.

8. An electrical device as recited in claim 5 wherein the substrate is a ball grid array package with a semiconductor die.

9. A solder ball comprising:

a substantially spherical, hollow metallic shell having an outer wall and a substantially spherical internal opening, the outer wall of the shell having a thickness A that is approximately between 5 to 15 µm, the internal opening having a diameter B, the shell having a diameter of A+B, the diameter of the shell being approximately between 200 to 280 µm, a plurality of holes penetrating entirely through the wall of the shell to the internal opening; and a solder material that encases the metallic shell and substantially entirely fills the plurality of holes and the internal opening, the solder material inside the shell, outside the shell and in the holes of the shell being continuously connected, the solder material arranged to flow out of the internal cavity and over a solder pad when the solder ball is positioned over the solder pad during a reflow process.

* * * * *